(12) United States Patent
Kim

(10) Patent No.: US 7,388,653 B2
(45) Date of Patent: Jun. 17, 2008

(54) EXPOSURE MASK AND METHOD FOR DIVISIONAL EXPOSURE

(75) Inventor: Seong-Bong Kim, Chungcheonnam-do (KR)

(73) Assignee: Samsung Electronics Co., Ltd., Chungcheonnam-Do (KR)

( * ) Notice: Subject to any disclaimer, the term of this patent is extended or adjusted under 35 U.S.C. 154(b) by 123 days.

(21) Appl. No.: 10/928,288

(22) Filed: Aug. 26, 2004

(65) Prior Publication Data

US 2005/0024622 A1    Feb. 3, 2005

(30) Foreign Application Priority Data

Sep. 1, 2003    (KR) .................... 10-2003-0060707

(51) Int. Cl.
  *G03B 27/32*    (2006.01)
  *G03B 27/42*    (2006.01)
  *G03B 27/54*    (2006.01)

(52) U.S. Cl. ................ 355/77; 355/53; 355/67

(58) Field of Classification Search ............ 355/67–71, 355/75, 53, 55, 77; 359/196, 227
  See application file for complete search history.

(56) References Cited

U.S. PATENT DOCUMENTS

| | | | | |
|---|---|---|---|---|
| 5,621,497 | A * | 4/1997 | Terasawa et al. ............. 355/53 |
| 5,729,331 | A * | 3/1998 | Tanaka et al. ................ 355/53 |
| 6,027,865 | A * | 2/2000 | Andoh ....................... 430/396 |
| 6,445,439 | B1 * | 9/2002 | McCullough ................ 355/30 |
| 6,476,905 | B1 * | 11/2002 | Li .............................. 355/71 |
| 6,774,983 | B2 * | 8/2004 | Kuchibhotla ................ 355/67 |
| 2001/0010578 | A1 * | 8/2001 | Fujimoto ..................... 355/53 |
| 2001/0012100 | A1 * | 8/2001 | Kurosawa et al. ............ 355/53 |
| 2001/0052966 | A1 * | 12/2001 | Fujisuka et al. .............. 355/53 |
| 2002/0145719 | A1 * | 10/2002 | Govil et al. .................. 355/69 |
| 2003/0091913 | A1 * | 5/2003 | Shiode ........................ 430/22 |
| 2003/0137644 | A1 * | 7/2003 | Tanaka et al. ................ 355/67 |

* cited by examiner

*Primary Examiner*—Hung Henry Nguyen
(74) *Attorney, Agent, or Firm*—Tom Chen; MacPherson Kwok Chen & Heid, LLP.

(57) ABSTRACT

An exposure mask and a method for divisional exposure are provided to advantageously reduce or eliminate stitch defects in displays. In one embodiment, an exposure mask comprises a masking panel and a slit for selectively transmitting light from a light source, the slit including a taper portion such that an area proximate the taper portion transmits less than full light intensity onto a substrate to be masked. In one example, the area proximate the taper portion is bounded between an inner corner and an outer corner of the taper portion. In a further example, the area proximate the taper portion transmits substantially one-half the light intensity onto the substrate to be masked. A method of divisional exposure utilizing the advantageous exposure mask is also disclosed.

10 Claims, 6 Drawing Sheets

EXPOSURE MASK AND METHOD FOR DIVISIONAL EXPOSURE

BACKGROUND (a) Field of the Invention

The present invention relates to an exposure mask and a method of divisional exposure.

(b) Description of Related Art

A display device, such as a liquid crystal display (LCD), includes a plurality of pixels arranged in a matrix, and each pixel includes a transparent pixel electrode for displaying images. The pixel electrodes are driven by signals from signal lines, including gate lines and data lines, that intersect each other to define pixel areas and are connected to the pixel electrodes through switching elements such as thin film transistors (TFTs). The switching elements control data signals from the data lines in response to scanning signals from the gate lines.

The LCD includes a TFT array panel including the signal lines, the pixel electrodes, and the TFTs, and a common electrode panel including a common electrode facing the pixel electrodes and a black matrix having openings facing the pixel areas.

When an active area on a backplane for LCDs is too large to use an exposure mask, the entire exposure is accomplished by repeating a divisional exposure called a "step-and-repeat" process. One divisional exposure unit or area is called a "shot". Since transition, rotation, distortion, and other problems are generated during light exposure, the shots may not be aligned accurately. Accordingly, parasitic capacitances generated between wires and pixel electrodes can differ depending on the shots, thereby causing a brightness difference between the shots which is recognizable at the pixels located proximate a boundary between the shots. Therefore, a "stitch" defect is generated on the screen of the LCD due to brightness discontinuity between the shots.

It has been suggested that boundaries of the shots be made saw-toothed or that several unit stitch areas be selectively subjected to light exposure simultaneously in order to reduce the stitch defect. However, the misalignment between adjacent shots is not effectively removed, and in addition, the misalignment in a direction perpendicular to a moving direction of an exposure mask is not solved.

SUMMARY

An exposure mask and a method for divisional exposure is provided to advantageously reduce or eliminate stitch defects in displays, in particular LCDs.

In accordance with one embodiment of the present invention, an exposure mask for a divisional exposure process is provided, comprising a masking panel; and a slit in the masking panel for selectively transmitting light from a light source, the slit including a taper portion such that an area proximate the taper portion transmits less than full light intensity onto a substrate to be masked. In one example, the area proximate the taper portion is bounded between an inner corner and an outer corner of the taper portion. In another example, the area proximate the taper portion transmits substantially one-half the light intensity onto the substrate to be masked.

In accordance with another embodiment, a divisional exposure photolithographic system is provided, comprising a light source and an exposure mask as described above. The system further includes a pattern mask aligned with the exposure mask, the pattern mask selectively transmitting light corresponding to a thin film pattern, and a plate aligned with the pattern mask, the plate supporting a substrate to be provided with the thin film pattern.

In accordance with yet another embodiment, a divisional exposure method is provided. The method comprises providing a masking panel including a slit for selectively transmitting light from a light source, the slit including taper portions such that an area proximate a taper portion transmits less than full light intensity onto a photoresist layer. The method further includes providing a pattern mask below the exposure mask, the pattern mask selectively transmitting light corresponding to a thin film pattern, providing a substrate below the pattern mask, the substrate to be provided with the thin film pattern, dividing the substrate into a plurality of shots, moving the pattern mask and the substrate relative to the masking panel and the light source, and twice exposing the photoresist layer in an area corresponding to a boundary area of two of the plurality of shots to form a photoresist pattern on the substrate. In one example, the area corresponding to a boundary area of two of the plurality of shots is covered by an overlap of taper portions of the slit.

BRIEF DESCRIPTION OF THE DRAWINGS

The present invention will become more apparent by describing embodiments thereof in detail with reference to the accompanying drawings in which.

DETAILED DESCRIPTION

Figure 1:
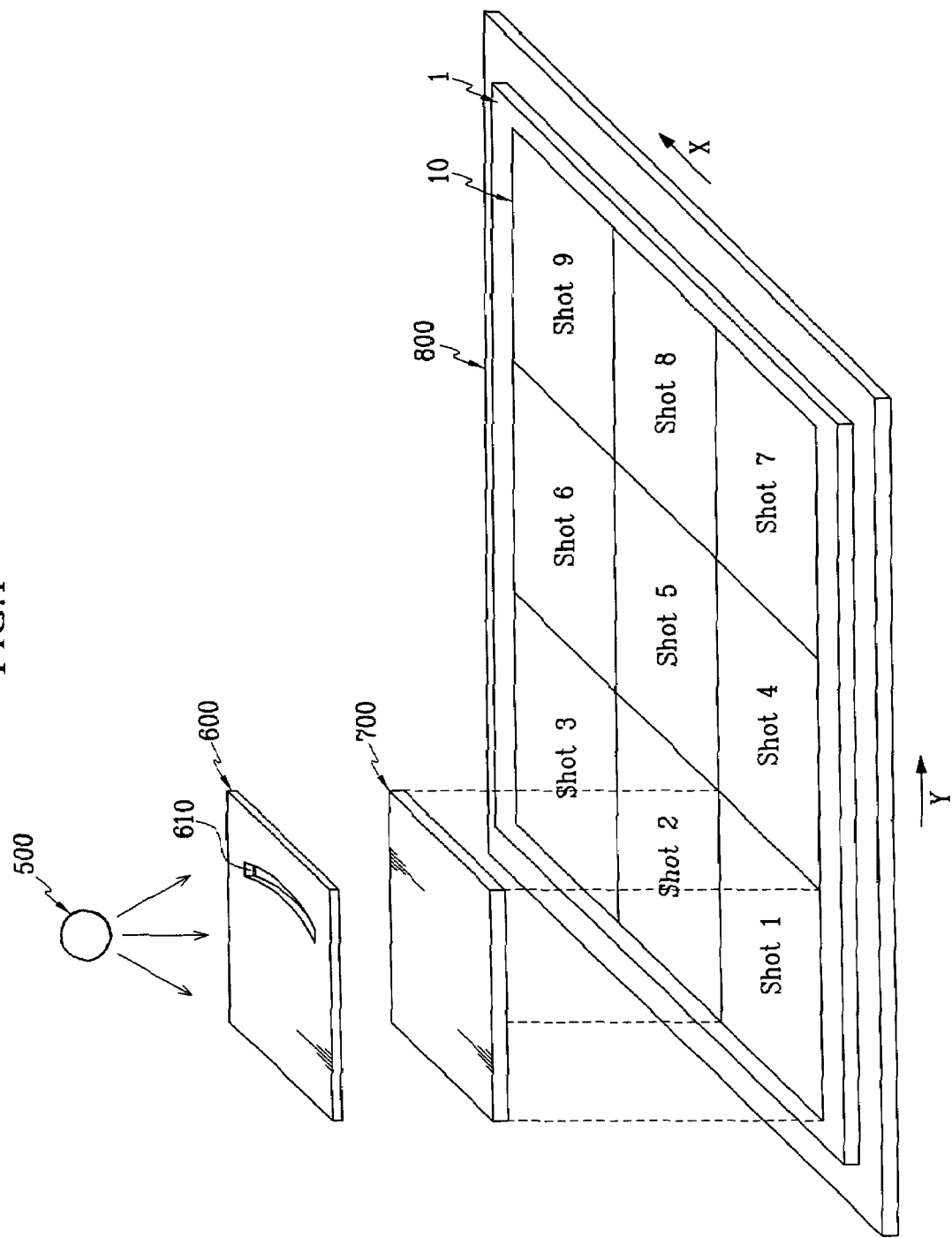
FIG. 1 illustrates an exposure step in a manufacturing method of a display panel according to an embodiment of the present invention.

The present invention now will be described more fully hereinafter with reference to the accompanying drawings. The present invention may be embodied in many different forms and should not be construed as limited to the embodiments set forth herein.

In the drawings, the thickness of layers, films, and regions are exaggerated for clarity. Like numerals refer to like elements throughout. It will be understood that when an element such as a layer, film, region, or substrate is referred to as being "on" another element, it can be directly on the other element or intervening elements may also be present. In contrast, when an element is referred to as being "directly on" another element, no intervening elements are present.

Exposure masks and methods of manufacturing a display device according to embodiments of the present invention will now be described with reference to the accompanying drawings. First, a photolithography process with an exposure mask according to an embodiment of the present invention is described in detail.

A display device such as an LCD includes a display area having a group of pixel areas arranged in a matrix for displaying images and a peripheral area disposed outside of the display area. A display area of a TFT array panel includes but is not limited to multiple thin film patterns including a plurality of signal lines, such as gate lines for transmitting scanning signals and data lines for transmitting data signals, a plurality of TFTs for controlling the data signals in response to the scanning signals, and a plurality of pixel electrodes for receiving the data signals. A peripheral area includes but is not limited to multiple thin film patterns including end portions of signal lines for receiving the scanning signals or the data signals from external driving circuits, an electrostatic discharge (ESD) protection circuit for discharging static electricity generated during a manufacturing process, and/or repair lines for repairing disconnection/short circuit of the signal lines. The thin film pattern in the peripheral area may further include driving circuits.

A manufacturing method of a TFT array panel includes several photolithography steps for providing thin film patterns. The photolithography step includes coating of a photoresist film and exposure of the photoresist film with a pattern mask. During this step, if an active area including a display area and a peripheral area is larger than an exposure mask or if a mother substrate including an active area provided with thin film patterns forming a plurality of display areas and a plurality peripheral areas is larger than an exposure mask, the exposure over the entire desired area is accomplished by dividing the active area and repeating a divisional exposure called a step-and-repeat process. That is, when a pattern is formed by depositing and photo-etching a conductive layer or an insulating layer, a photoresist on an active area, including a display area and a peripheral area or a plurality of display areas and a plurality of peripheral areas, is required to be exposed to light after dividing the active area into a plurality of shots, which will be described in greater detail below.

FIG. 1 illustrates an exposure step in a manufacturing method of a display panel according to an embodiment of the present invention.

Referring to FIG. 1, according to an embodiment of the present invention, exposure equipment includes a light source 500, an exposure mask 600 including a slit 610 that defines a transmission area for restrictively transmitting the light from the light source 500, a pattern mask 700 including blocking areas and transmissive areas for selectively blocking and transmitting the light corresponding to thin film patterns, and a plate 800 for fixing and supporting a mother substrate 1 to be provided with the thin films.

At this time, the mother substrate 1 includes one active area 10 as shown in FIG. 1 and the active area 10 may include one display area and one peripheral area or a plurality of display areas and a plurality of peripheral areas.

The active area 10 covered with a photoresist is divided into several exposure areas, referred to as shots, that are separately exposed to light in a process which may also be referred to as a shot. FIG. 1 shows first to ninth shots.

A divisional exposure is performed in one embodiment by fixing the light source 500 and the exposure mask 600 and moving the pattern mask 700 and the plate 800 in X- and Y-directions by a pitch or a distance between the shots. In each shot, the light passing through the slit 610 of the exposure mask 600 is selectively transmitted by the pattern formed on the pattern mask 700 and reaches the photoresist on the substrate 1. The shot is repeatedly performed nine times by moving the pattern mask 700 and the plate 800 since the active area 10 has nine shots.

The slit 610 of the exposure mask 600 defines a transmission area transmitting the light from light source 500, and the light intensity passing through the slit 610 has an error of about ±10% (due to the difficulty in determining the width of the slit 610 that can give the same light intensity). In this example, the light from the light source 500 is radially irradiated and the slit 610 has the shape of an arc.

A slit 610 of the exposure mask 600 according to an embodiment of the present invention has a taper portion having a decreasing width at its end, which will be described in detail with reference to the figures.

Figure 2A:
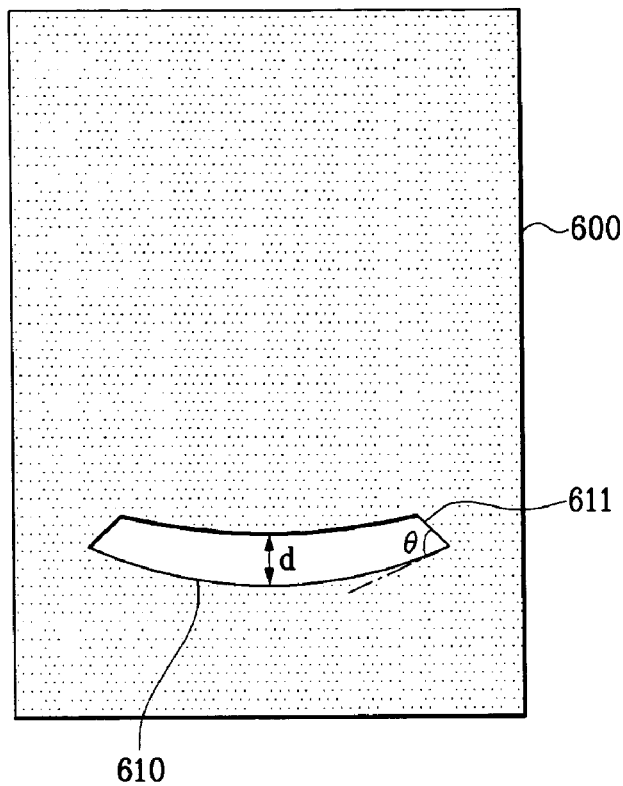
FIGS. 2a and 2b are plan views of exposure masks according to embodiments of the present invention.
Figure 2B:
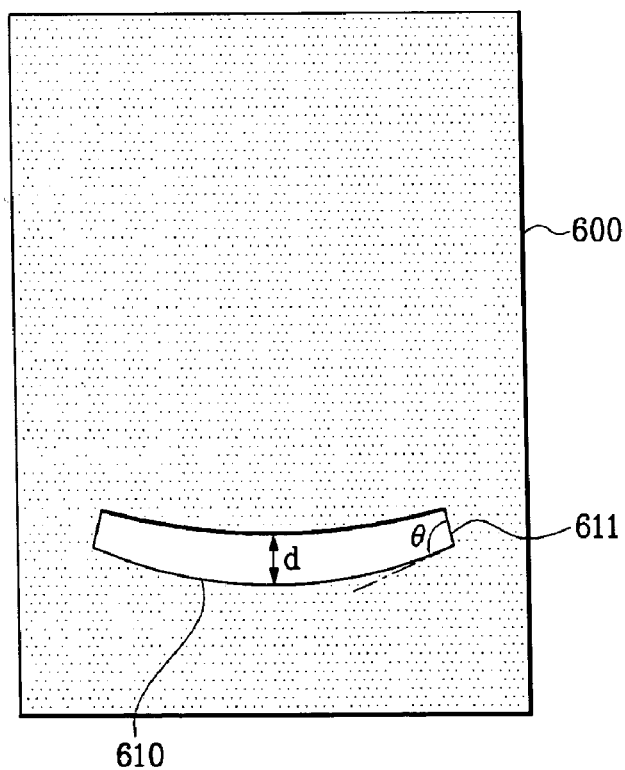
Figure 3:
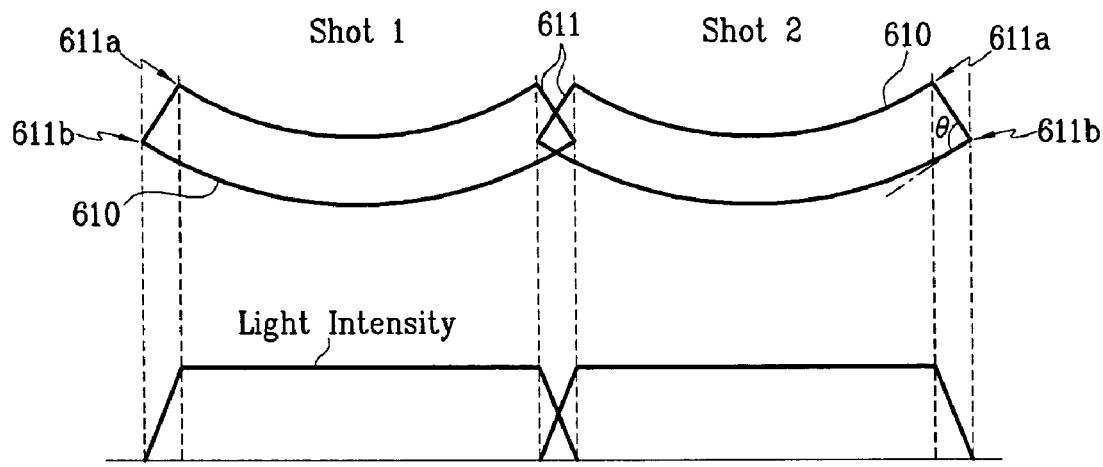
FIG. 3 illustrates alignment of a slit in the exposure mask shown in FIG. 2a or 2b in adjacent shots according to an embodiment of the present invention.

FIGS. 2a and 2b are plan views of exposure masks according to embodiments of the present invention, and FIG. 3 illustrates alignment of a slit in the exposure mask shown in FIGS. 2a or 2b in adjacent shots according to an embodiment of the present invention.

Referring to FIGS. 2a and 2b, an exposure mask 600 according to an embodiment has a slit 610 in the shape of an arc and includes a taper portion 611 having decreased width "d". The decreased width of the taper portion 611 means that the width of slit 610 decreases with respect to a direction normal to the passing direction of the light. In one example, a boundary of the taper portion 611 that is an end of the slit 610 makes an angle θ of about 70° to about 110° with a tangent of the arc. FIG. 2a shows the angle θ smaller than the right angle, while FIG. 2b shows the angle larger than the right angle. In this embodiment, as the slit 610 has a shape substantially of an arc, the width of the slit decreases from a center to the taper portion 611. In other embodiments, the width of slit 610 may not decrease but remain constant to the taper portion 611.

As shown in FIG. 3, the light exposure process using the exposure mask 600 (FIGS. 1 and 2a-2b) aligns the substrate 1 (FIG. 1) with the plate 800 (FIG. 1) and the pattern mask 700 (FIG. 1) such that the taper portions 611 between the first and the second shots overlap each other. That is, a portion of the photoresist near an edge of a shot, which corresponds to an area proximate the taper portion 611 between an inner corner 611a and an outer corner 611b, is twice exposed to light with increasing or decreasing light intensity. Accordingly, the portions of the photoresist near a boundary of the first and the second shots (substantially between inner corner 611a and outer corner 611b) are exposed to light with a partial intensity in a first exposure step, and then they are exposed to light again such that the total exposure for the area is substantially equivalent to a single light exposure with full intensity, as shown by the graph of "Light Intensity" at the bottom of FIG. 3.

In a manufacturing method of a panel for an LCD according to the embodiments of the present invention, portions of a photoresist disposed near a boundary of adjacent shots are twice exposed to light to form a photoresist pattern, and then a thin film pattern is formed by using the photoresist pattern as an etch mask. Accordingly, the stitch defect that can result from a fine misalignment between the pattern mask 700, the plate 800, and the exposure mask 600, is reduced.

In addition, the width "d" of the slit 610 in the exposure mask 600 for obtaining the light intensity with an error of ±10% ranges between about 20 mm and about 120 mm in one embodiment. Preferably, the width "d" may be extended to a range of between about 80 mm and about 100 mm, thereby minimizing the exposure time for the photoresist.

Although the slit in the exposure mask shown in FIGS. 2a and 2b has the shape of an arc, the slit may be rectilinear, which is described in detail below with reference to FIGS. 4 and 5.

Figure 4:
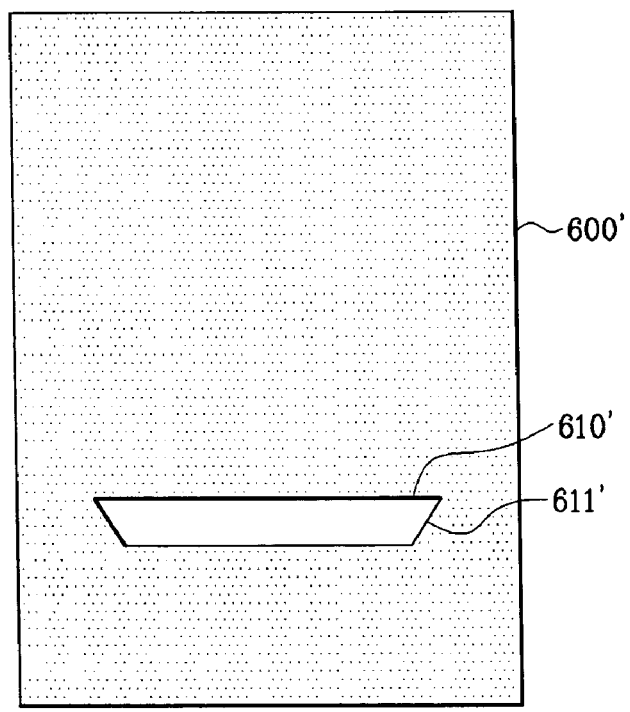
FIG. 4 is a plan view of an exposure mask according to another embodiment of the present invention.
Figure 5:
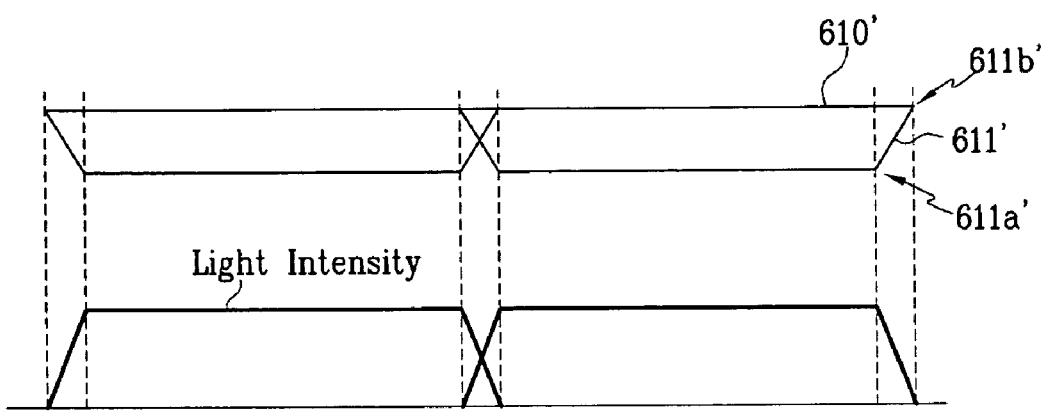
FIG. 5 illustrates alignment of a slit in the exposure mask shown in FIG. 4 in adjacent shots according to an embodiment of the present invention.

FIG. 4 is a plan view of an exposure mask according to another embodiment of the present invention, and FIG. 5 illustrates the alignment of a slit in the exposure mask shown in FIG. 4 in adjacent shots according to an embodiment of the present invention.

Referring now to FIG. 4, an exposure mask 600' according to this embodiment has a rectilinear slit 610' defining a transmission area. Taper portions 611' of the slit 610'0 is tapered such that the slit 610' is trapezoidal. The intensity of light passing through the slit 610' may also have an error of about ±10%.

As shown in FIG. 5, the light exposure process using the exposure mask 600' aligns the substrate 1 (FIG. 1) with the plate 800 (FIG. 1) and the pattern mask 700 (FIG. 1) such that the adjacent taper portions 611' between the first and the second shots overlap each other. Then, portions of the photoresist near a boundary of the first and the second shots are exposed to light with a partial intensity in a first exposure step, followed by exposure to light in a second exposure step such that the total exposure for the photoresist area corresponding to an area proximate the taper portions between inner corner 611a' and outer corner 611b' is equivalent to a light exposure with full intensity. In addition, since the slit 610' is rectilinear, portions of the photoresist disposed in a line is simultaneously subjected to light exposure. That is, although the curved slit 610 shown in FIG. 2A or 2B exposes portions of the photoresist disposed in a line at different times in a shot, the rectilinear slit 610' exposes portions of the photoresist disposed in a line at the same time in a shot, thereby solving stitch defect in the Y-direction (FIG. 1).

Figure 6:
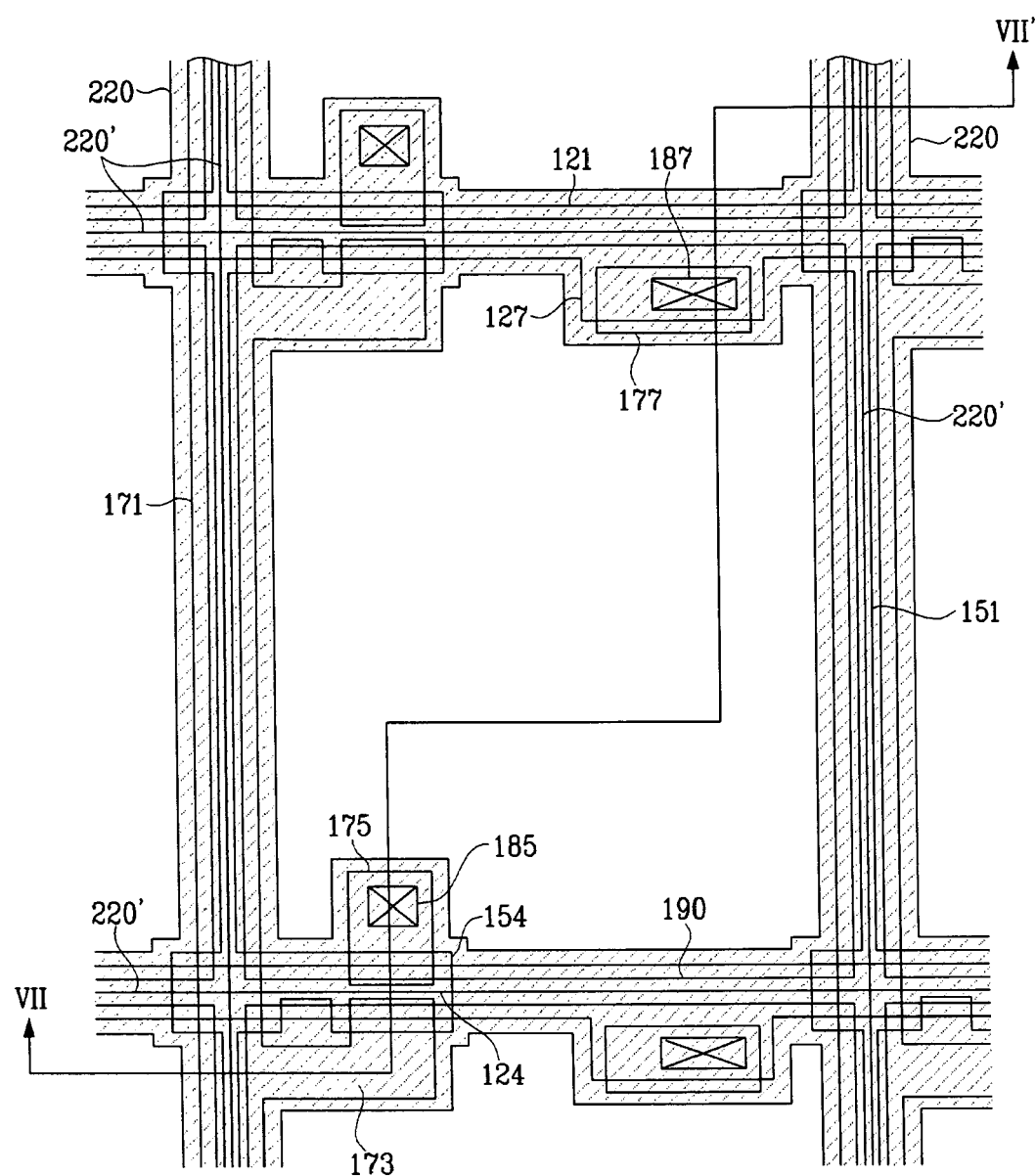
FIG. 6 is a layout view of an LCD according to an embodiment of the present invention.
Figure 7:
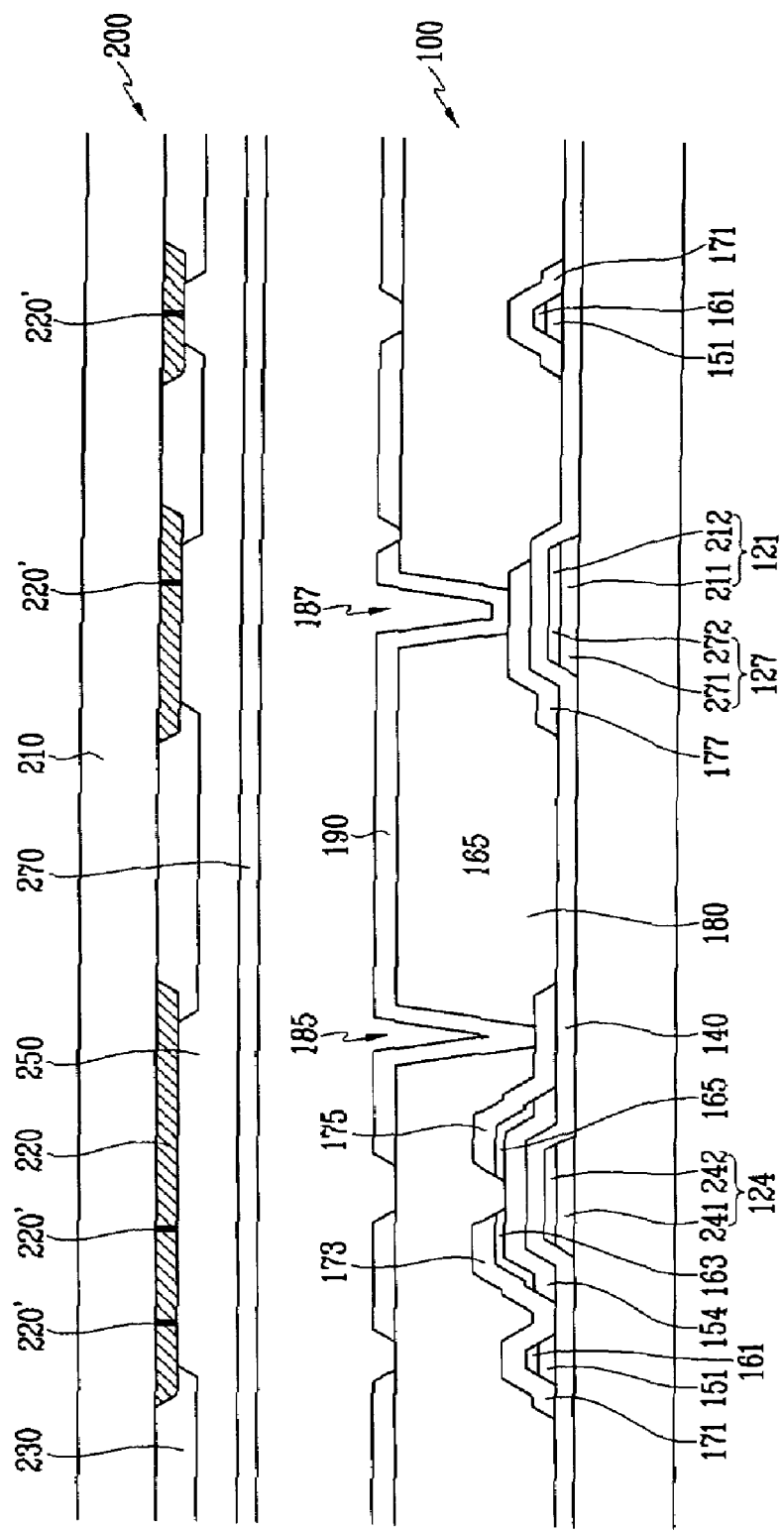
FIG. 7 is a sectional view of the LCD shown in FIG. 6 taken along the line VII-VII'.

An LCD according to an embodiment of the present invention is now described in detail with reference to FIGS. 6 and 7. FIG. 6 is a layout view of an LCD according to an embodiment of the present invention, and FIG. 7 is a sectional view of the LCD shown in FIG. 6 taken along the line VII-VII'.

An LCD according to an embodiment of the present invention includes a TFT array panel 100, a common electrode panel 200 facing the TFT array panel 100 with a predetermined gap, and a liquid crystal (LC) layer (not shown) filled in the gap between the TFT array panel 100 and the common electrode panel 200. Alignment layers (not shown) for aligning LC molecules in the LC layer may be coated on inner surfaces of the panels 100 and 200.

Regarding the TFT array panel 100, a plurality of gate lines 121 for transmitting gate signals are formed on an insulating substrate 110. A gate line 121 extends substantially in a transverse direction and a plurality of portions of each gate line 121 form a plurality of gate electrodes 124. A gate line 121 may also include a plurality of expansions 127 protruding downward.

In one embodiment, the gate lines 121 include two films having different physical characteristics, a lower film and an upper film. The upper film is preferably made of low resistivity metal including Al-containing metal such as Al or Al alloy for reducing signal delay or voltage drop in the gate lines 121. The lower film is preferably made of material such as Cr, Mo, and/or Mo alloy having good contact characteristics with other materials such as indium tin oxide (ITO) or indium zinc oxide (IZO). A good exemplary combination of the lower film material and the upper film material is Cr and Al—Nd alloy, respectively. In FIG. 7, the lower and the upper films of the gate electrodes 124 are indicated by reference numerals 241 and 242, respectively, and the lower and the upper films of the expansion 127 are indicated by reference numerals 271 and 272, respectively.

The lateral sides of the upper film and the lower film are inclined relative to a surface of the substrate 110, and the inclination angle thereof may range between about 30 degrees and about 80 degrees.

A gate insulating layer 140 preferably made of silicon nitride (SiNx) is formed on the gate lines 121.

A plurality of semiconductor stripes 151 preferably made of hydrogenated amorphous silicon (abbreviated to "a-Si") are formed on the gate insulating layer 140. Each semiconductor stripe 151 extends substantially in a longitudinal direction and has a plurality of projections 154 branched out toward the gate electrodes 124. The width of each semiconductor stripe 151 becomes large near the gate lines 121 such that the semiconductor stripe 151 covers large areas of the gate lines 121.

A plurality of ohmic contact stripes and islands 161 and 165 preferably made of silicide or n+ hydrogenated a-Si heavily doped with n-type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are tapered, and the inclination angles thereof are preferably in a range between about 30 degrees and about 80 degrees.

A plurality of data lines 171, a plurality of drain electrodes 175, and a plurality of storage capacitor conductors 177 are formed on the ohmic contact stripes 161, the ohmic contact islands 165, and the gate insulating layer 140, respectively.

The data lines 171 for transmitting data voltages extend substantially in the longitudinal direction and intersect the gate lines 121. A plurality of branches of each data line 171, which project toward the drain electrodes 175, form a plurality of source electrodes 173. Each drain electrode 175 is separated from the data lines 171 and disposed opposite a source electrode 173 with respect to a gate electrode 124. A gate electrode 124, a source electrode 175, and a drain electrode 175, along with a projection 154 of a semiconductor stripe 151, form a TFT having a channel formed in the projection 154 disposed between the source electrode 173 and the drain electrode 175.

The storage capacitor conductors 177 overlap the expansions 127 of the gate lines 121. In one example, the data lines 171, the drain electrodes 175, and the storage capacitor conductors 177 include a conductive film preferably made of Mo, Mo alloy, Cr, Al, and/or Al alloy. However, they may also have a triple-layered structure including (1) Mo or Mo ally, (2) Al, and (3) Mo or Mo alloy. Similar to the gate lines 121, the data lines 171, and the drain electrodes 175, the storage capacitor conductors 177 have tapered lateral sides, and the inclination angles thereof may range between about 30 degrees and about 80 degrees.

The ohmic contacts 161 and 165 are interposed between the underlying semiconductor stripes 151 and the overlying data lines 171 and the overlying drain electrodes 175 thereon and reduce the contact resistance therebetween. The semiconductor stripes 151 include a plurality of exposed portions, which are not covered with the data lines 171 and the drain electrodes 175, such as portions located between the source electrodes 173 and the drain electrodes 175. Although the semiconductor stripes 151 are narrower than the data lines 171 at most places, the width of the semiconductor stripes 151 becomes large near the gate lines as described above to smooth the profile of the surface, thereby preventing the disconnection of the data lines 171.

A passivation layer 180 is formed on the data lines 171, the drain electrodes 175, the storage conductors 177, and the exposed portions of the semiconductor stripes 151. The passivation layer 180 is preferably made of photosensitive organic material having a good flatness characteristic or low dielectric insulating material such as a-Si:C:O and a-Si:O:F formed by plasma enhanced chemical vapor deposition (PECVD). The passivation layer 180 may have a double-layered structure including an inorganic lower film preferably made of silicon nitride or silicon oxide and an organic upper film such that the exposed portions of the semiconductor stripes 151 do not contact organic material.

The passivation layer 180 has a plurality of contact holes 185 and 187 exposing the drain electrodes 175 and the storage conductors 177, respectively.

A plurality of pixel electrodes 190, which are preferably made of transparent conductive material such as ITO and IZO, or reflective conductive material such as Al and Ag, are formed on the passivation layer 180.

The pixel electrodes 190 are physically and electrically connected to the drain electrodes 175 through the contact holes 185 and to the storage capacitor conductors 177 through the contact holes 187 such that the pixel electrodes 190 receive the data voltages from the drain electrodes 175 and transmit the received data voltages to the storage capacitor conductors 177. The pixel electrodes 190 supplied with the data voltages generate electric fields in cooperation with a common electrode 270 on the common electrode panel 200, which reorient LC molecules in the LC layer disposed therebetween.

The pixel electrode 190 and the common electrode 270 form a LC capacitor $C_{LC}$, which stores applied voltages after turning off the TFT Q. An additional capacitor called a "storage capacitor," which is connected in parallel to the LC capacitor $C_{LC}$, is provided for enhancing the voltage storing capacity. The storage capacitors are implemented by overlapping the pixel electrodes 190 with the gate lines 121 adjacent thereto (called "previous gate lines"). The capacitances of the storage capacitors, i.e., the storage capacitances, are increased by providing the expansions 127 at the gate lines 121 for increasing overlapping areas and by providing the storage capacitor conductors 177 under the pixel electrodes 190 and over the expansions 127 for connecting to the pixel electrodes while decreasing the distance between the terminals. Otherwise, a storage electrode (not shown) may be added that is preferably made of the same layer as the gate lines 121 and overlaps the pixel electrode 190.

The pixel electrodes 190 may optionally overlap the gate lines 121 and the data lines 171 to increase aperture ratio.

The common electrode panel 200 facing the TFT array panel 100 includes an insulating substrate 210 preferably made of transparent glass, and a light blocking member 220 called a black matrix that has a plurality of openings facing the pixel electrodes 190 and preferably made of negative organic material or light blocking material. The TFT array panel 100 further includes a plurality of red, green, and blue color filters 230 disposed substantially in the openings defined by the light blocking member 220, an overcoat 250 formed on the color filters 230 and the light blocking member 220, and a common electrode 270 formed on the overcoat 250 and preferably made of transparent conductor such as ITO and IZO.

According to a method of manufacturing the LCD shown in FIGS. 6 and 7, thin film patterns such as the gate lines 121, the data lines 171, the pixel electrodes 190, the insulating layers 140 and 180, and the light blocking member 220, are formed by photo-etching thin films using the above-described photoresist patterns as etch masks. The photoresist patterns are formed by divisional exposure and development as taught above, and the exposure process may use the exposure mask shown in FIGS. 2a, 2b, and/or 4.

The TFT array panel 100 and the common electrode panel 200 are aligned and assembled with a gap therebetween and liquid crystal is injected into the gap to form a LC layer. At this time, a portion 220' of light blocking member 220, corresponding to a boundary of a unit stitch area that is twice exposed to light, overlaps the gate lines 121 and the data lines 171, thereby preventing spots in an image.

Although the color filters 230 are disposed on the common electrode panel 200 in this embodiment, the color filters may be disposed on the TFT array panel 100 in other embodiments, preferably located on or under the passivation layer 180.

As described above, the boundaries of the shots in a divisional exposure method of manufacturing a panel for an LCD cross over openings of the light blocking member or twice exposed portions in boundaries of the light blocking member overlap the signal lines, thereby minimizing the stitch defect represented as spots.

While the present invention has been described in detail with reference to the above-described embodiments, those skilled in the art will appreciate that various modifications and substitutions can be made thereto without departing from the spirit and scope of the present invention as set forth in the appended claims. For example, the present invention can be employed in a manufacturing method for a semiconductor device and the structure of the pixels can have various modifications.

What is claimed is:

1. A divisional exposure method, comprising:
providing a masking panel including an arc-shaped slit for selectively transmitting light from a light source, the slit including taper portions such that an area proximate a taper portion transmits less than full light intensity onto a photoresist layer, wherein the end of each of the taper portions has a linear edge, and wherein the exposure mask has one single arc-shaped slit in one masking panel;
providing a pattern mask below the exposure mask, the pattern mask selectively transmitting light corresponding to a thin film pattern;
providing a substrate below the pattern mask, the substrate to be provided with the thin film pattern;
dividing the substrate into a plurality of shots;
exposing the photoresist layer in the area corresponding to a first shot of light;
moving the pattern mask and the substrate relative to the masking panel and the light source; and
exposing the photoresist layer in an area corresponding to a second shot of light;
wherein the area corresponding to a boundary area of the first shot and the second shot is covered by an overlap of taper portions of the slit and the portion of the photoresist disposed at the boundary area of the first shot and the second shot are twice exposed to light, resulting in the twice exposed boundary areas being exposed with the same intensity as the other exposed areas.

2. The method as in claim 1, wherein the area proximate the taper portion is bounded between an inner corner and an outer corner of the taper portion.

3. The method as in claim 1, wherein the area proximate the taper portion transmits substantially one-half the light intensity onto the photoresist layer.

4. The method as in claim 1, wherein the portion twice exposed is exposed to substantially full light intensity.

5. The method as in claim 1, further comprising etching through the photoresist pattern to form a thin film pattern.

6. The method as in claim 1, wherein an angle of the taper portion formed between a line from an inner corner to an outer corner of the taper portion and an arc tangent at the outer corner is between about 70 degrees and about 110 degrees.

7. The method as in claim 1, wherein the width of the slit is variable.

8. The method as in claim 1, wherein the width of the slit ranges between about 20 mm and about 120 mm.

9. The method as in claim 1, wherein the width of the slit ranges between about 80 mm and about 100 mm.

10. The method as in claim 1, wherein the thin film pattern is selected from the group consisting of a gate line, a data line, a pixel electrode, an insulating layer, and a light blocking member.

* * * * *